United States Patent [19]

Guo

[11] Patent Number: 6,103,580
[45] Date of Patent: Aug. 15, 2000

[54] METHOD TO FORM ULTRA-SHALLOW BURIED-CHANNEL MOSFETS

[75] Inventor: Jyh-Chyurn Guo, Hsin-Chu, Taiwan

[73] Assignee: Vanguard International Semiconductor Corporation, Hsin-Chu, Taiwan

[21] Appl. No.: 09/270,589

[22] Filed: Mar. 18, 1999

[51] Int. Cl.[7] ................................................ H01K 21/336
[52] U.S. Cl. ..................... 438/291; 438/217; 438/276; 438/282; 438/305
[58] Field of Search .................................... 438/217, 276, 438/282, 291, 305, FOR 188, FOR 191, FOR 324

[56] References Cited

U.S. PATENT DOCUMENTS

| 3,867,204 | 2/1975 | Rutledge . |
| 4,045,811 | 8/1977 | Dingwall . |
| 4,108,686 | 8/1978 | Jacobus, Jr. . |
| 4,824,797 | 4/1989 | Goth . |
| 5,573,964 | 11/1996 | Hsu et al. . |
| 5,766,998 | 6/1998 | Tseng . |
| 5,792,699 | 8/1998 | Tsui . |

OTHER PUBLICATIONS

Wolf, "Silicon Processing for the VLSI Era", vol. 2, Lattice Press, p. 17, 1990.

Primary Examiner—George Fourson
Assistant Examiner—Joannie A. Garcia
Attorney, Agent, or Firm—George O. Saile; Stephen B. Ackerman; Rosemary L. S. Pike

[57] ABSTRACT

A method to form buried channel MOSFETs in an integrated circuit is described. Field oxide isolation regions overlying a semiconductor substrate are provided. The surface of the substrate in the active device regions is cleaned. A doped silicate glass layer overlying the field oxide regions and the substrate is deposited and etched to remove the silicate glass layers in all areas except where counter-doped junctions of the buried channel MOSFETs are planned. The substrate and the doped silicate glass are annealed to diffuse ions from the doped silicate glass into the substrate and to form the counter-doped junctions. The silicate glass is etched away. The surface of the substrate is cleaned in the active device regions. A gate oxide layer is deposited. A doped polysilicon layer is deposited and etched to form gates for the MOSFETs overlying the counter-doped junctions. Sidewall spacers are formed. Ions are implanted into the substrate to form the source and drain regions for the MOSFETs and are annealed to form lightly doped regions. Metal connective traces are formed through openings in a dielectric layer to underlying source and drain regions. A passivation layer completes the integrated circuit.

20 Claims, 5 Drawing Sheets

METHOD TO FORM ULTRA-SHALLOW BURIED-CHANNEL MOSFETS

BACKGROUND OF THE INVENTION (1) Field of the Invention

The invention relates to a method of fabricating semiconductor structures, and more particularly, to the formation of ultra-shallow buried-channel MOSFETs.

(2) Description of the Prior Art

In integrated circuit applications such as 256 Megabit or larger dynamic random access memories (DRAM), very small feature sizes, down to the 0.18 micron regime, are required. Additionally, very short gate delays, as low as 40 picoseconds, are required to achieve the switching speeds needed. In these regimes, very small MOS transistors, and more specifically, buried-channel MOS transistors are used. Techniques to reduce the size, or scaling, of buried-channel transistors bring great challenges.

When compared with surface channel MOS transistors, buried-channel MOS can provide the advantage of higher switching speeds due to higher carrier mobility. Additionally, the extended use of N+ polysilicon gates to form PMOS buried-channel transistors can simplify the manufacturing process and keep costs low. Due to these advantages, it is common in the art to use buried-channel MOS, and specifically PMOS, in very high density, very high speed integrated circuits. Unfortunately, buried-channel devices suffer from more severe short-channel effects than surface channel devices. A new fabrication process is proposed in this invention to overcome the short channel effects problem and to successfully implement a sub-0.25 micron buried-channel PMOS transistor.

To fabricate a very small and very high-speed buried-channel device a method to create an ultra-shallow counter-doped channel must be used. To achieve both higher speed at a lower supply voltage and higher memory capacity at smaller chip size, the device channel length and threshold voltage must be reduced. Specifically, a reduced threshold voltage requires that the buried-channel junction concentration must be increased. Unfortunately, this leads to greater leakage currents and punch-through effects. To offset these problems the junction must therefore be made very shallow. It is desirable that the device has a channel length of less than 0.25 microns and a threshold voltage of less than 0.65V. To achieve these specifications for a p-channel MOSFET, for example, the counter-doped channel must be less than 0.04 microns in depth with a doping concentration exceeding $10^{18}$ cm$^{-3}$.

Typically in the art, creating such an ultra-shallow counter-doped p-channel would require an ultra-low energy implant of ions such as $B^{11}$ or $BF_2$. Such an approach requires the manufacturing plant to invest in an ultra-low energy implanter and in rapid thermal processing (RTP) equipment. Another approach that has been proposed is the use of a pre-amorphization step. This technique has the disadvantage of the implant inducing surface states and junction leakage. Yet another strategy is to implant ions with heavy masses, such as $B_{10}H_{14}$ and $I^{49}$. The drawbacks with this approach are the scarcity of the implant sources and the difficulty of activating the ion species. Another approach to creating ultra-shallow junctions is to implant through the gate oxide. However, this compromises the integrity of the gate oxide. Finally, an epitaxial technique could be used to grow a counter-doped layer. This would be incompatible with the standard CMOS processing used in the formation of the integrated circuit.

Several prior art approaches attempt to create device junctions in unique ways or attempt to form very small MOSFET devices that are less prone to short-channel effects. U.S. Pat. No. 5,737,964 to Hsu et al shows a method of doping the source, drain, and polysilicon gate of a thin film transistor using a doped silicate glass (PSG or BSG) layer. Ions are diffused up into the polysilicon gate and the thin film silicon to form the source and drain. This patent discloses a thin film transistor process and does not use the doped silicate glass to form the transistor channel. U.S. Pat. No. 5,792,699 to Tsui shows a method for forming a p-channel MOSFET using an ion implant after the polysilicon gate and the source and drain regions are formed. U.S. Pat. No. 5,766,998 to Tseng displays an ion implanted channel stop process where the source and drain regions are formed by diffusion of ions from the doped polysilicon. U.S. Pat. No. 4,824,797 to Goth shows a self-aligned punch through region.

SUMMARY OF THE INVENTION

A principal object of the present invention is to provide an effective and very manufacturable method of fabricating buried-channel MOSFETs in the manufacture of integrated circuits.

A further object of the present invention is to provide a method for forming buried-channel MOSFETs with ultra-shallow channel junctions in the manufacture of integrated circuits.

Another object of the present invention is to provide a method for forming doped junctions in a semiconductor substrate in the manufacture of integrated circuits.

In accordance with the objects of this invention, a new method of fabricating buried-channel MOSFETs in the manufacture of an integrated circuit has been achieved. This method uses a doped silicate glass layer to source ions for the counter-doped ultra-shallow channel of the MOSFET. A semiconductor substrate is provided. A field oxide isolation layer is provided and patterned over the surface of the substrate isolating active device regions. The surface is cleaned to remove native oxide. A doped silicate glass layer is deposited overlying the isolation layer and substrate. The doped silicate glass layer is selectively etched to remove the layer in all areas except where the buried-channel gates are planned. A rapid thermal anneal is performed to cause diffusion of the doping ions from the doped silicate glass layer to the substrate to form the channel junctions in the substrate. The remaining doped silicate glass layer is removed and the surface is cleaned to remove any oxide. A gate oxide is deposited overlying the isolation layer and substrate. A doped polysilicon layer is deposited overlying the gate oxide. The polysilicon layer is patterned and etched to form the polysilicon gates of the MOSFETs. Silicon dioxide spacers are formed on the sidewalls of the polysilicon gates. Silicon nitride spacers are formed on the silicon dioxide spacers. An ion implant is performed to form the source and drain regions. An anneal is performed to activate the ions in the source and drain regions and to cause out diffusion of ions to form lightly doped drain (LDD) regions in the sources and drains. An interlevel dielectric is deposited overlying the surface of the semiconductor device. The interlevel dielectric is etched through to the surface of the substrate to form contact holes for the gates, sources and drains. A metal layer is deposited to fill the contact holes and overlay the interlevel dielectric. The metal layer is patterned and etched to form connective traces. A plasma nitride layer is formed overlying the metal layer and interlevel dielectric.

This completes the formation of the buried-channel MOSFETs in the integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
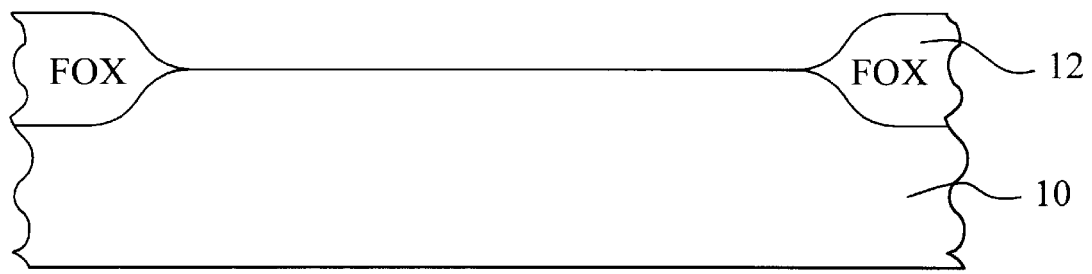
FIGS. 1 through 11 schematically illustrate in cross-sectional representation a preferred embodiment of the present invention.

Referring now more particularly to FIG. 1, there is illustrated a cross section of a partially completed buried-channel MOSFET. Semiconductor substrate 10 is preferably composed of monocrystalline silicon doped N-type to a concentration of between about $1.0 \times 10^{17}$ ions/cm$^3$ and $5.0 \times 10^{17}$ ions/cm$^3$. A field oxide isolation layer 12 is conventionally grown on the surface of the substrate in areas defined by a masking operation that is not shown. The isolation layer 12 defines and isolates active device regions.

Figure 12:
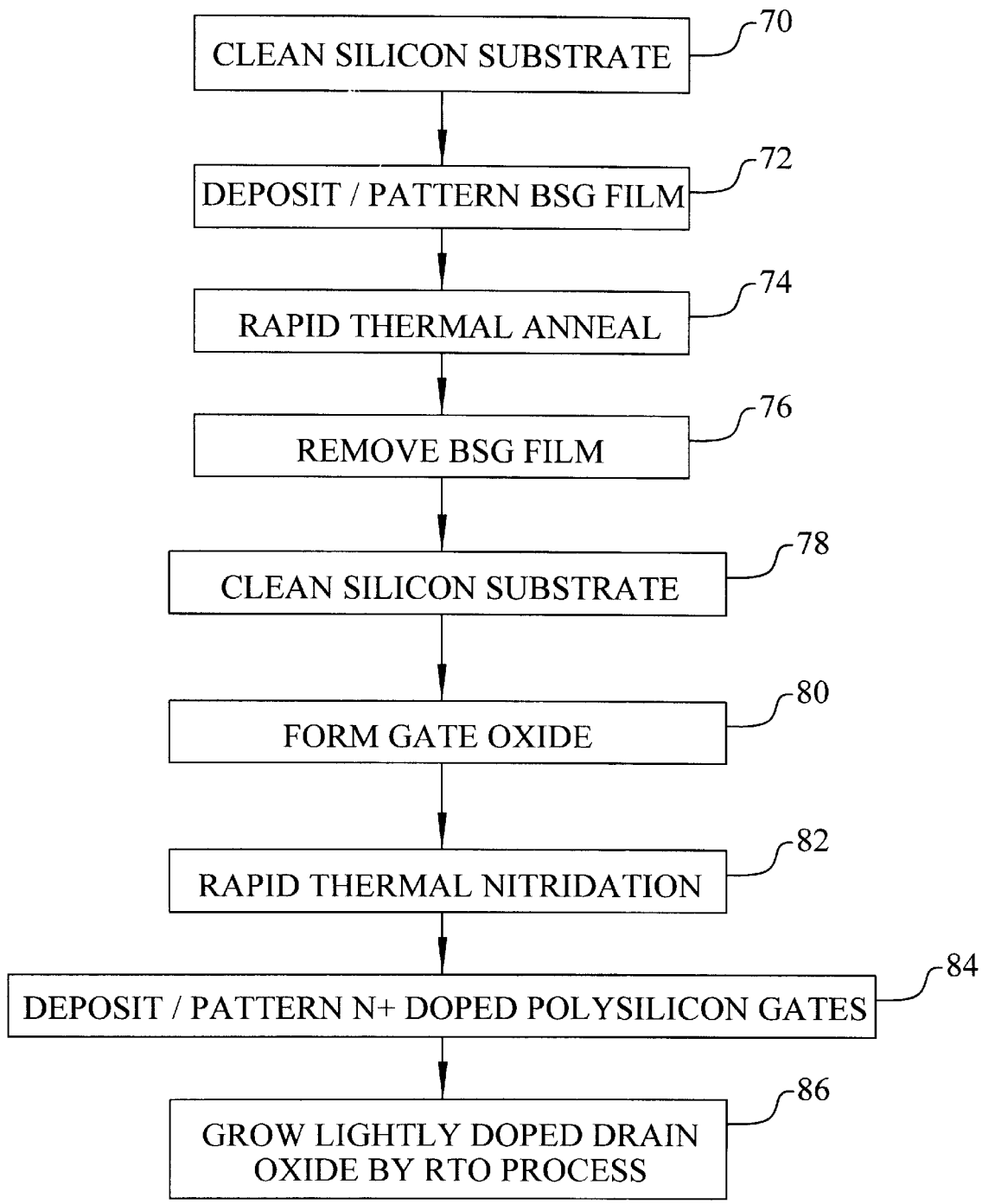
FIG. 12 is a process flow chart of part of the fabrication sequence for the present invention.

The surface of the substrate is cleaned, preferably by using a wet clean recipe of $NH_4OH$, $H_2O_2$, and $H_2O$. Ratios of between about 0.1 and 0.3 parts $NH_4OH$, 4 parts $H_2O_2$, and 20 parts $H_2O$ are used at a temperature of about 30 degrees C. The wet dip operation removes any native oxide films on the surface of the active device regions as shown in FIG. 12 step number 70.

Figure 2:
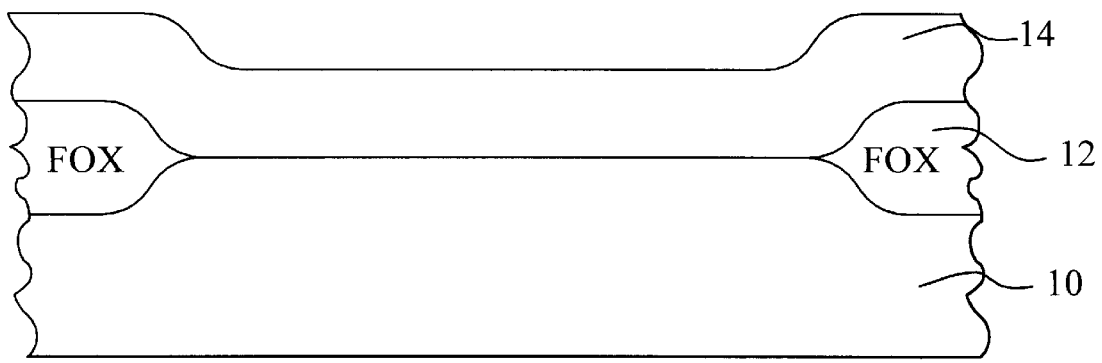

Referring now to FIG. 2, an important feature of the invention is disclosed. A doped silicate glass layer 14 is deposited on the whole surface of the substrate 10, including overlying the isolation layer 12. This silicate glass layer 14 is doped with boron to form BSC. In the preferred embodiment, the doped silicate glass layer 14 is deposited using a chemical vapor deposition (CVD) method. The doped silicate glass layer 14 is deposited to a thickness of between about 1000 Angstroms and 3000 Angstroms. The boron concentration of the doped silicate glass layer 14 is between about $1.0 \times 10^{19}$ ions/cm$^3$ and $1.0 \times 10^{20}$ ions/cm$^3$.

Figure 3:
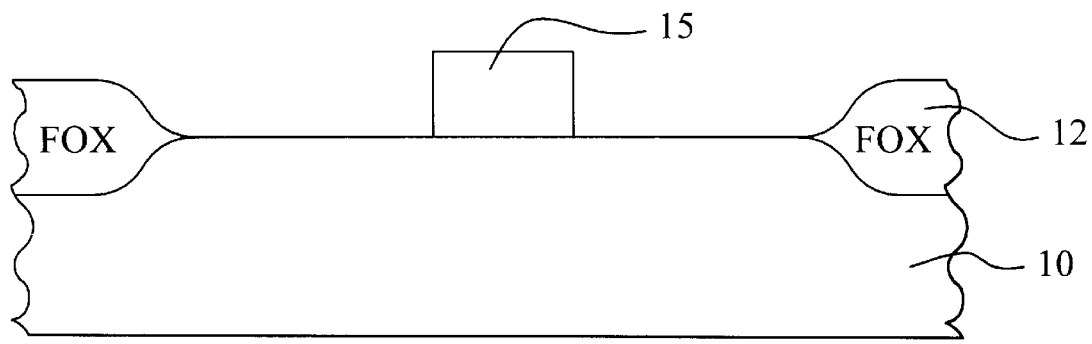

Referring now to FIG. 3, the doped silicate glass layer 14 is patterned using a conventional photolithography and etch sequence. In another important feature, the doped silicate glass layer 14 is removed except for areas where the gates of the MOSFETs are planned. The remaining doped silicate glass forms doping gates 15 that will act as sources for diffusion ions in the annealing step. The deposition and patterning of the doped silicate glass layer is shown in FIG. 12 as step number 72.

Figure 4:
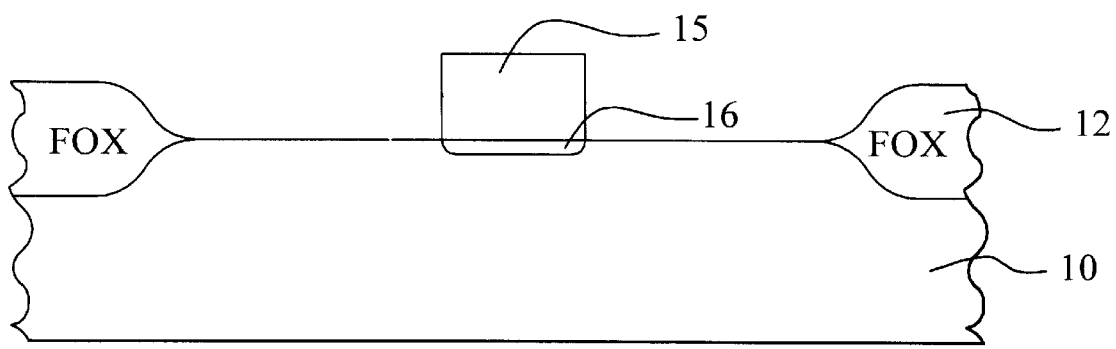

Referring to FIG. 4, the key feature of a rapid thermal anneal (RTA) is performed. In the preferred embodiment, the RTA is performed for between about 1000 degrees C and 1050 degrees C for between about 10 seconds and 20 seconds. During the annealing, boron ions diffuse from the doping gates 15 into the substrate to form shallow counter-doped P-type junctions 16. Extensive study and experiments support that solid state diffusion from the highly doped BSG doping gates 15 yields very steep boron junction profiles 16 in the substrate 10. In the preferred embodiment, the junctions are between about 0.02 microns and 0.04 microns deep with a peak concentration of between about $1.0 \times 10^{18}$ ions/cm$^3$ and $2.0 \times 10^{18}$ ions/cm$^3$. The rapid thermal anneal is shown in FIG. 12 as step number 74.

Figure 5:
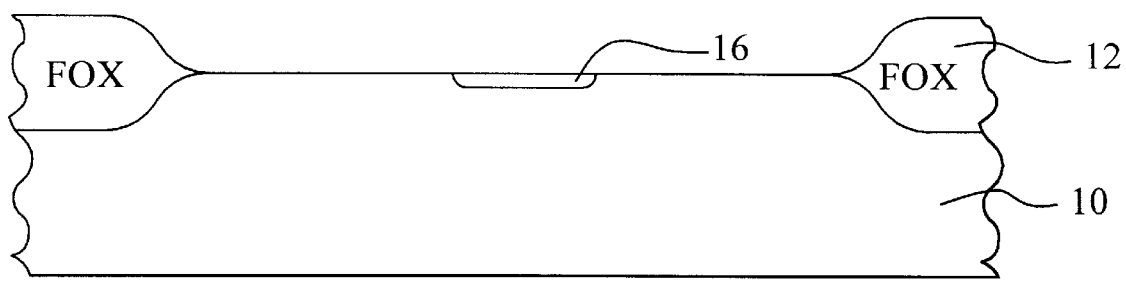

Referring to FIG. 5, the doping gates 15 are etched away, preferably using a buffered HF wet etch. The removal of the doped silicate glass is shown as FIG. 12, step number 76. If needed, the surface of the substrate is then cleaned, preferably by using a clean recipe and dilute hydrofluoric acid (DHF) dip, to remove any oxide films on the surface of the active device regions as shown in FIG. 12 step number 78.

Figure 6:
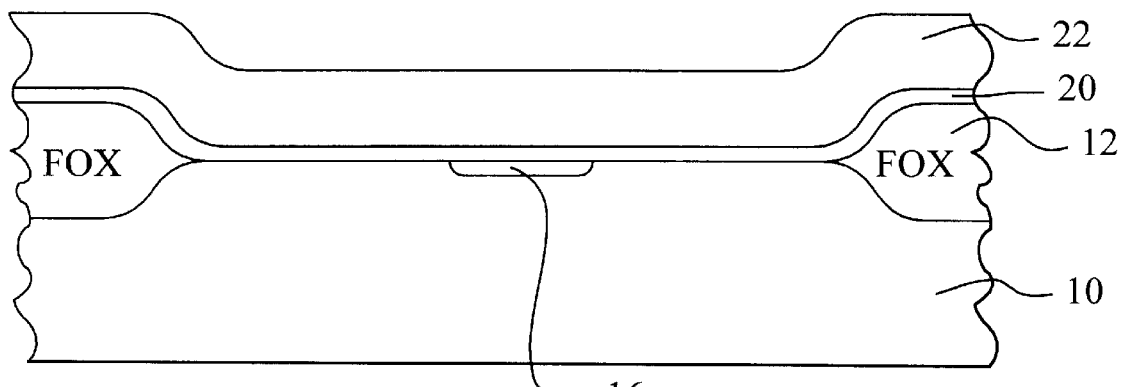

Referring now to FIG. 6, a gate oxide 20 is formed overlying the entire surface of the substrate 10, including the isolation regions 12. The gate oxide 20 is preferably grown using a rapid thermal oxidation (RTO) to a thickness of between about 40 Angstroms and 60 Angstroms. RTO can provide the advantage of growing a high quality ultra-thin oxide while suppressing dopant diffusion during the gate oxide growth. The growth of the gate oxide 20 is shown in FIG. 12 as step number 80.

After the gate oxide 20 is grown, it is conditioned. A rapid thermal nitridation (RTN) is performed in a vacuum chamber to form oxynitride on the gate oxide 20 for improvement of hot carrier immunity. The rapid thermal nitridation step is shown in FIG. 12 as step 82.

A layer of heavily doped (N+) polysilicon 22 is deposited overlying the gate oxide 20. This polysilicon layer 22 is preferably insitu doped with phosphorous. The polysilicon layer 22 is deposited to a thickness of between about 1000 Angstroms and 1500 Angstroms with a phosphorous concentration of between about $5.0 \times 10^{20}$ ions/cm$^3$ and $1.0 \times 10^{21}$ ions/cm$^3$.

Figure 7:
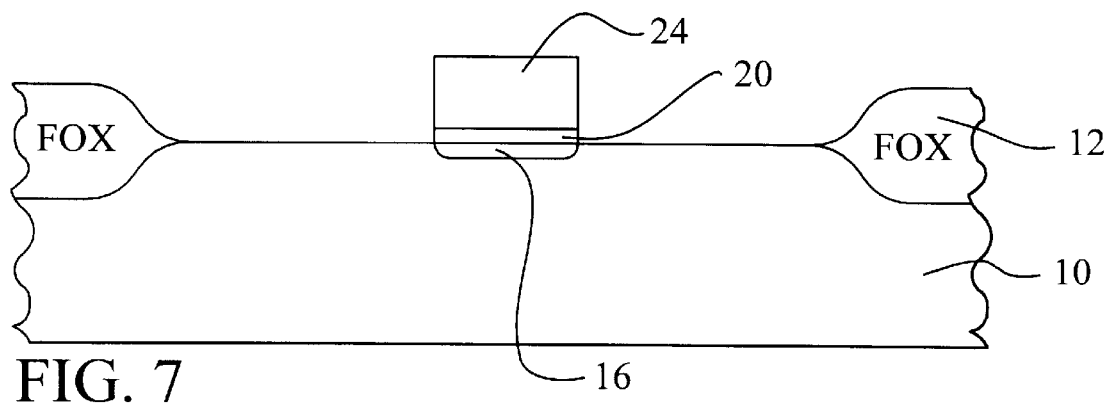

Referring to FIG. 7, the polysilicon layer 22 is patterned using a conventional photolithographic and etch sequence to form the polysilicon gate 24 of the MOSFET. The deposition and patterning of the polysilicon gate 24 is shown in FIG. 12 as step number 84.

Figure 8:
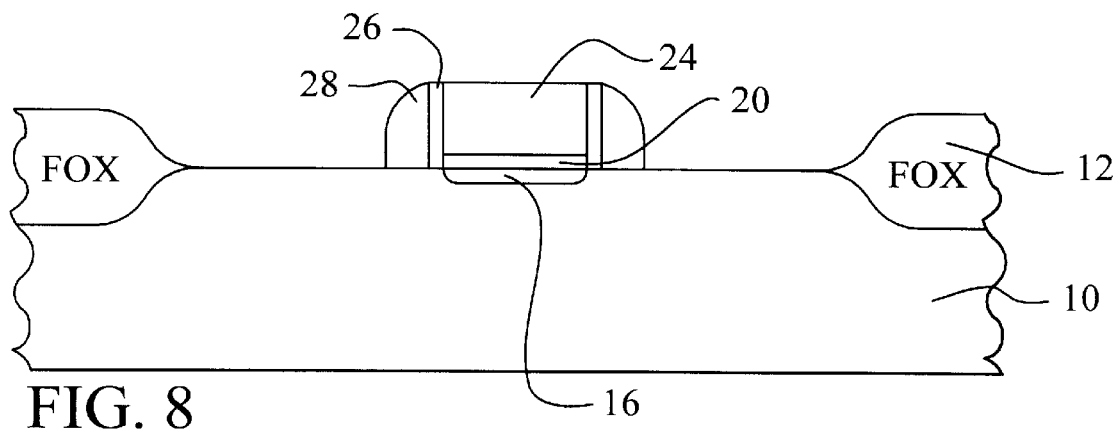

Referring now to FIG. 8, silicon dioxide spacers 26 are preferably formed on the sidewalls of the gate 24. These silicon dioxide spacers 26 are formed to a thickness of between about 100 Angstroms and 150 Angstroms using a RTO process at a temperature of between about 1000 degrees C and 1050 degrees C for between about 30 seconds and 50 seconds. The formation of silicon dioxide spacer 26 is called the lightly doped drain or LDD oxide and is shown in FIG. 12 as step number 86. Next, a silicon nitride layer 28 is deposited overlying the silicon dioxide spacers 26 and the gate 24, using a CVD process, to a thickness of between about 400 Angstroms and 500 Angstroms. The silicon nitride layer 28 is anisotropically plasma etched to form silicon nitride sidewall spacers having a thickness of between about 400 Angstroms and 500 Angstroms.

Figure 9:
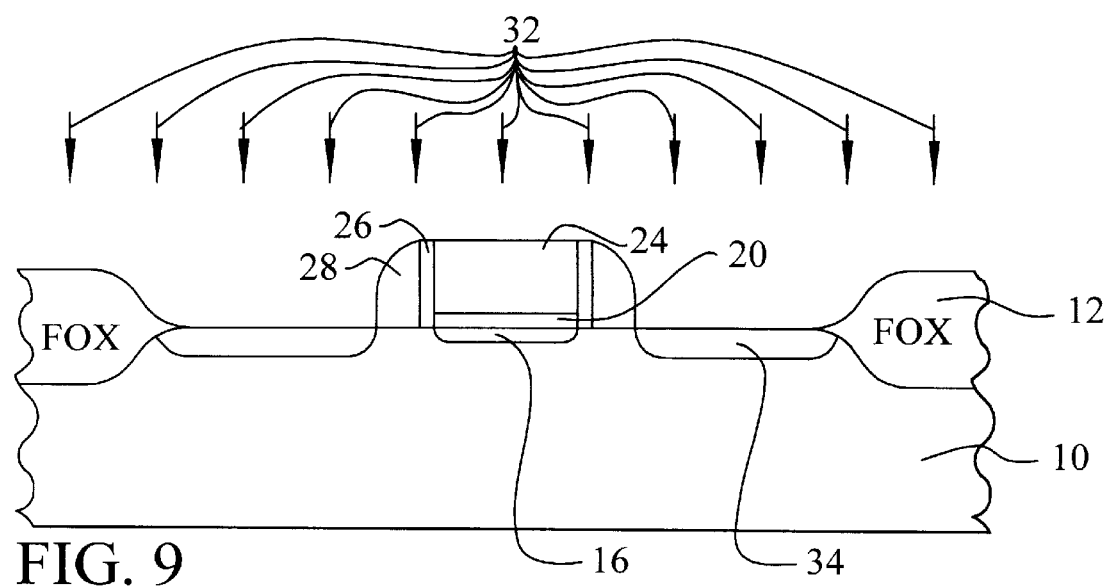

Referring to FIG. 9, an ion implant 32 is performed to create the source and drain regions 34 of the MOSFET. The implant 32 is preferably composed of $BF_4$ ions implanted at a dose of between about $2.5 \times 10^{15}$ ions/cm$^2$ and $3.0 \times 10^{15}$ ions/cm$^2$ and an implanting energy of between about 30 KeV and 40 KeV.

Figure 10:
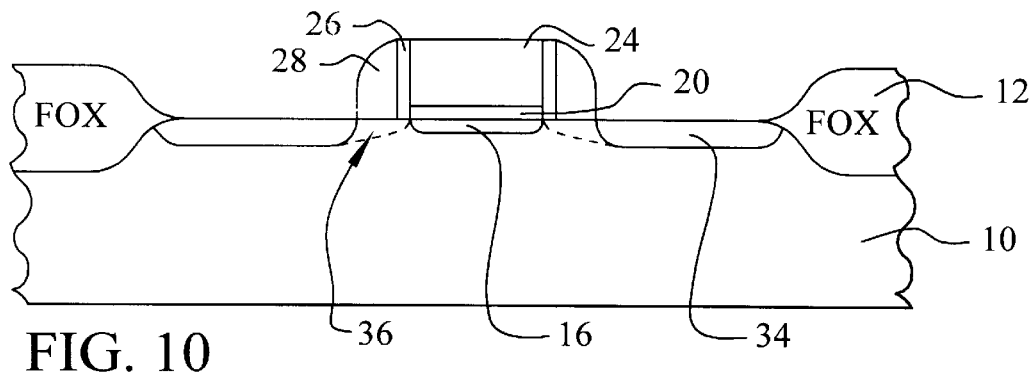

Referring now to FIG. 10, after the implantation step, a rapid thermal anneal (RTA) is performed at a temperature of between about 950 degrees C and 1000 degrees C for between about 5 seconds and 10 seconds in an ambient of nitrogen. This anneal step activates the doping ions in the drain and source regions 34. It also causes movement of ions in the source and drain regions to form lightly doped drain regions 36.

Figure 11:
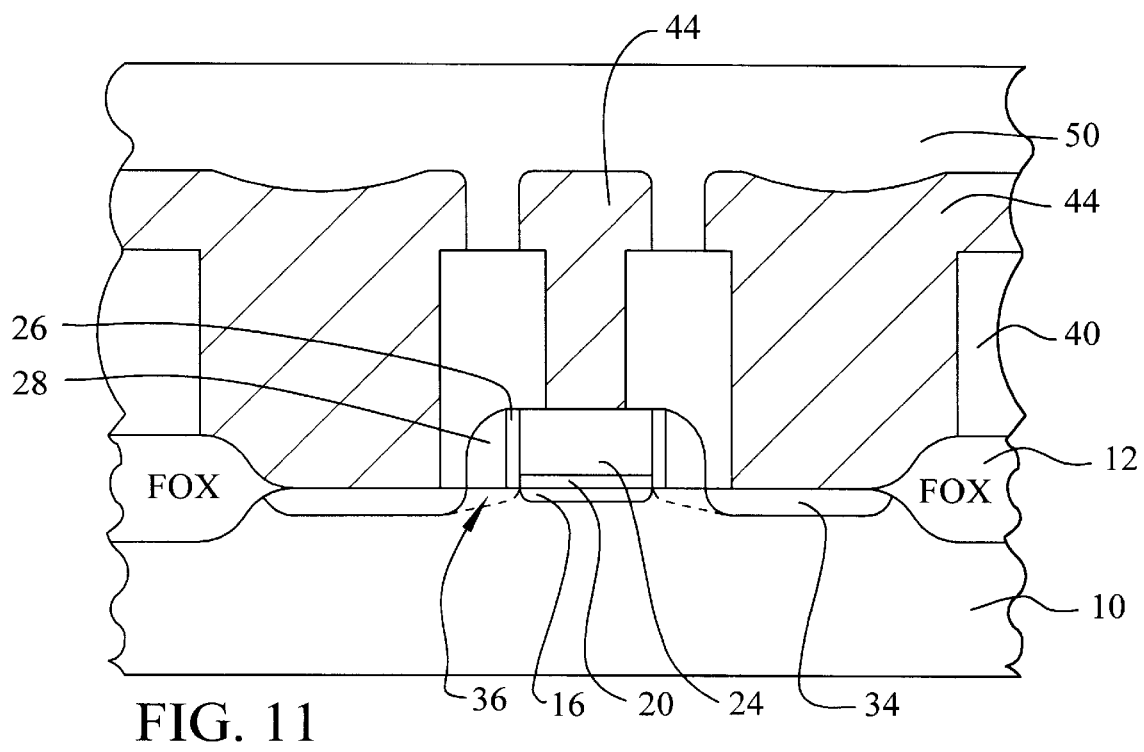

Referring now to FIG. 11, the MOSFET device is completed in conventional fashion. An interlevel dielectric layer 40 is deposited overlying the surface of the substrate including the gate structure. Contact holes are etched through the interlevel dielectric layer 40 to the polysilicon gate 24 and the source and drain regions 34 of the MOSFET. A layer of metal 44 is deposited overlying the interlevel dielectric layer 40 and filling the contact holes. The metal layer 44 is patterned and etched to form connective features. Finally, a layer of passivation 50, typically composed of silicon nitride may be deposited to insulate the MOSFET device.

The process of the present invention provides a very manufacturable process for ultra-shallow buried-channel MOSFETs. Device sizes of less than 0.25 microns with buried-channel junction depths or less than 0.04 microns are achieved. Threshold voltages of 0.65 volts are attained. Potentially devices with threshold voltages as low as 0.5 volts should be possible.

While the invention has been particularly shown and described with reference to the preferred embodiments thereof, it will be understood by those skilled in the art that various changes in form and details may be made without departing from the spirit and scope of the invention.

What is claimed is:

1. A method of forming buried channel MOSFETs in an integrated circuit comprising:

providing a semiconductor substrate;

providing field oxide isolation regions overlying said substrate isolating active device regions;

cleaning the surface of said substrate in said active device regions;

depositing a doped silicate glass layer overlying said field oxide regions and said substrate;

etching said doped silicate glass to remove said doped silicate glass layer in all areas except where counter-doped junctions of said buried channel MOSFETs are planned;

annealing said substrate and said doped silicate glass to diffuse ions from said doped silicate glass into said substrate and thereby forming said counter-doped junctions;

etching away all of remaining said doped silicate glass;

thereafter, cleaning said surface of said substrate in said active device regions;

depositing a gate oxide layer overlying said field oxide regions and said substrate;

depositing a doped polysilicon layer overlying said gate oxide;

etching said doped polysilicon layer to form polysilicon gates of said MOSFETs overlying said counter-doped junctions;

forming silicon dioxide spacers on the sidewalls of said polysilicon gates;

depositing a silicon nitride layer overlying said polysilicon gates;

etching said silicon nitride layer to form silicon nitride spacers on said silicon dioxide spacers;

implanting ions into said substrate through exposed areas of said substrate adjacent to said nitride spacers and thereby forming source and drain regions of said MOSFETS;

annealing said substrate to activate said implanted ions and to outwardly diffuse said ions from said source and drain regions into said substrate and thereby forming lightly doped regions adjacent to said source and drain regions and connecting said source and drain regions to said counter-doped junctions;

depositing an interlevel dielectric overlying the surfaces of said MOSFETs and said field oxide isolation regions;

etching an opening through said interlevel dielectric to one of said source and drain regions;

depositing a metal layer overlying said interlevel dielectric and filling said opening;

etching said metal layer to form metal connective traces;

depositing a passivation layer overlying said metal connective traces and said interlevel dielectric; and completing said integrated circuit.

2. The method according to claim 1 wherein said doped silicate glass is doped with boron to a concentration of between about $1.0 \times 10^{19}$ ions/cm$^3$ and $1.0 \times 10^{20}$ ions/cm$^3$.

3. The method according to claim 1 wherein said step of annealing of said substrate and said doped silicate glass to diffuse ions from said doped silicate glass into said substrate and thereby forming said counter-doped junctions is performed at a temperature of between about 1000 degrees C and 1050 degrees C for a time of between about 10 seconds and 20 seconds.

4. The method according to claim 1 wherein said counter-doped junctions are formed to a depth of between about 0.02 microns and 0.04 microns.

5. The method according to claim 1 wherein said counter-doped junctions are formed with a peak concentration of between about $1.0 \times 10^{18}$ ions/cm$^3$ and $2.0 \times 10^{18}$ ions/cm$^3$.

6. The method according to claim 1 wherein said gate oxide is deposited to a thickness of between about 40 Angstroms and 60 Angstroms.

7. The method according to claim 1 wherein said doped polysilicon layer is deposited to a thickness of between about 1000 Angstroms and 1500 Angstroms.

8. The method according to claim 1 wherein said step of annealing said substrate to activate said implanted ions and to outwardly diffuse said ions from said source and drain regions into said substrate and thereby forming lightly doped regions adjacent to said source and drain regions is performed at a temperature of between about 950 degrees C and 1000 degrees C for a time of between about 5 seconds and 10 seconds.

9. A method of forming buried P-channel MOSFETs in an integrated circuit comprising:

providing an N-type doped semiconductor substrate;

providing field oxide isolation regions overlying said substrate isolating active device regions;

cleaning said surface of said substrate in said active device regions;

depositing a P-type doped silicate glass layer overlying said field oxide regions and said substrate;

etching said P-type doped silicate glass to remove said P-type doped silicate glass layer in all areas except where P-type counter-doped junctions of said buried P-channel MOSFETs are planned;

annealing said substrate and said P-type doped silicate glass to diffuse ions from said P-type doped silicate glass into said substrate and thereby forming said P-type counter-doped junctions;

etching away all of remaining said P-type doped silicate glass;

thereafter, cleaning said surface of said substrate in said active device regions;

depositing a gate oxide layer overlying said field oxide regions and said substrate;

depositing an N-type doped polysilicon layer overlying said gate oxide;

etching said polysilicon layer to form polysilicon gates of said MOSFETs overlying said P-type counter-doped junctions;

forming silicon dioxide spacers on the sidewalls of said polysilicon gates;

depositing a silicon nitride layer overlying said polysilicon gates;

etching said silicon nitride layer to form silicon nitride spacers on said silicon dioxide spacers;

implanting ions into said substrate through exposed areas of said substrate adjacent to said sidewall spacers and thereby forming P-type source and drain regions of said MOSFETS;

annealing said substrate to activate said implanted ions and to outwardly diffuse said ions from said source and drain regions into said substrate and thereby forming lightly doped regions adjacent to said source and drain regions and connecting said P-type source and drain regions to said P-type counter-doped junctions;

depositing an interlevel dielectric overlying the surface of said MOSFETs and said field oxide isolation regions;

etching openings through said interlevel dielectric to said polysilicon gates and said source and drain regions;

depositing a metal layer overlying said interlevel dielectric and filling said openings;

etching said metal layer to form metal connective traces;

depositing a passivation layer overlying said metal connective traces and said interlevel dielectric; and completing said integrated circuit.

10. The method according to claim 9 wherein said P-type silicate glass is doped with boron to a concentration of between about $1.0 \times 10^{19}$ ions/cm$^3$ and $1.0 \times 10^{20}$ ions/cm$^3$.

11. The method according to claim 9 wherein said step of annealing of said substrate and said P-type doped silicate glass to diffuse ions from said P-type doped silicate glass into said substrate and thereby forming said counter-doped junctions is performed at a temperature of between about 1000 degrees C and 1050 degrees C for a time of between about 10 seconds and 20 seconds.

12. The method according to claim 9 wherein said P-type counter-doped junctions are formed to a depth of between about 0.02 microns and 0.04 microns.

13. The method according to claim 1 wherein said P-type counter-doped junctions are formed with a peak concentration of between about $1.0 \times 10^{18}$ ions/cm$^3$ and $2.0 \times 10^{18}$ ions/cm$^3$.

14. The method according to claim 9 wherein said gate oxide is deposited to a thickness of between about 40 Angstroms and 60 Angstroms.

15. The method according to claim 9 wherein said N-type polysilicon layer is deposited to a thickness of between about 1000 Angstroms and 1500 Angstroms.

16. The method according to claim 9 wherein said step of annealing said substrate to activate said implanted ions and to outwardly diffuse said ions into said substrate and thereby form lightly doped P-type regions adjacent to said source and drain regions is performed at a temperature of between about 950 degrees C and 1000 degrees C for a time of between about 5 seconds and 10 seconds.

17. A method of fabricating a P-type doped junction in a substrate in the manufacture of an integrated circuit comprising:

providing a semiconductor substrate;

providing field oxide isolation regions overlying said substrate isolating active device regions;

depositing a boron doped silicate glass layer overlying said field oxide regions and said substrate; etching said boron doped silicate glass to remove said boron doped silicate glass layer in all areas except where said P-type doped junctions are planned;

annealing said substrate and said boron doped silicate glass to diffuse boron ions from said boron doped silicate glass into said substrate and thereby forming said P-type doped junctions;

etching away all of remaining said boron doped silicate glass;

thereafter, cleaning said surface of said substrate in said active device regions;

depositing a gate oxide layer overlying said field oxide regions and said substrate;

depositing an N-type doped polysilicon layer overlying said gate oxide;

etching said polysilicon layer to form polysilicon gates overlying said P-type doped junctions;

forming silicon dioxide spacers on the sidewalls of said polysilicon gates;

depositing a silicon nitride layer overlying said polysilicon gates;

etching said silicon nitride layer to form silicon nitride spacers on said silicon dioxide spacers;

implanting ions into said substrate through exposed areas of said substrate adjacent to said sidewall spacers and thereby forming P-type source and drain regions;

annealing said substrate to activate said implanted ions and to outwardly diffuse said ions from said source and drain regions into said substrate and thereby forming lightly doped regions adjacent to said source and drain regions and connecting said P-type source and drain regions to said P-type doped junctions;

depositing an interlevel dielectric overlying said polysilicon gates and said field oxide isolation regions;

etching openings through said interlevel dielectric to said polysilicon gates and said source and drain regions;

depositing a metal layer overlying said interlevel dielectric and filling said openings;

etching said metal layer to form metal connective traces;

depositing a passivation layer overlying said metal connective traces and said interlevel dielectric; and completing said integrated circuit.

18. The method according to claim 17 wherein said boron doped silicate glass is doped to a concentration of between about $1.0 \times 10^{19}$ ions/cm$^3$ and $1.0 \times 10^{20}$ ions/cm$^3$.

19. The method according to claim 17 wherein said step of annealing of said substrate and said boron doped silicate glass to diffuse ions from said boron doped silicate glass into said substrate and thereby forming said P-type doped junctions is performed at a temperature of between about 1000 degrees C and 1050 degrees C for a time of between about 10 and 20 seconds.

20. The method according to claim 17 wherein said P-type doped junctions are formed to a depth of between about 0.02 microns and 0.04 microns.

* * * * *